(12) United States Patent
Yamaguchi et al.

(10) Patent No.: US 7,538,626 B2
(45) Date of Patent: May 26, 2009

(54) VOLTAGE CONTROLLED OSCILLATOR CIRCUIT WITH DIFFERENT SIZED SHUNT TRANSISTORS

(75) Inventors: Tatsuya Yamaguchi, Fukuoka (JP); Kazunori Hayami, Fukuoka (JP); Satoshi Yamamoto, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/492,835

(22) Filed: Jul. 26, 2006

(65) Prior Publication Data
US 2007/0236298 A1      Oct. 11, 2007

(30) Foreign Application Priority Data
Mar. 22, 2006  (JP) .............................. 2006-079615

(51) Int. Cl.
*H03K 3/03* (2006.01)
(52) U.S. Cl. ........................... 331/57; 331/185; 327/103
(58) Field of Classification Search ................... 331/57, 331/185; 327/103
See application file for complete search history.

(56) References Cited

U.S. PATENT DOCUMENTS

| | | | | |
|---|---|---|---|---|
| 5,036,216 A | * | 7/1991 | Hohmann et al. ............ | 327/157 |
| 5,774,404 A | * | 6/1998 | Eto .............................. | 365/222 |
| 6,690,241 B2 | * | 2/2004 | Ooishi et al. ................. | 331/57 |
| 6,992,536 B2 | * | 1/2006 | Kiyose et al. ............ | 331/177 R |
| 7,061,295 B2 | * | 6/2006 | Saiki et al. ................... | 327/295 |
| 2003/0218510 A1 | * | 11/2003 | Hwang et al. ................ | 331/57 |

FOREIGN PATENT DOCUMENTS

| | | |
|---|---|---|
| JP | 7058602 | 3/1995 |
| JP | 2002171165 | 6/2002 |

\* cited by examiner

*Primary Examiner*—Robert Pascal
*Assistant Examiner*—Levi Gannon
(74) *Attorney, Agent, or Firm*—Hanify & King, P.C.

(57) ABSTRACT

A voltage controlled oscillator circuit includes a ring oscillator including a plurality of delay circuits that are connected like a ring and a voltage to current converter circuit for controlling current flowing in the ring oscillator so as to change an oscillation frequency thereof. The voltage to current converter circuit 11 is provided with a shunt circuit for shunting a part of current obtained by converting input voltage, and the shunted part of the current is used for controlling the current flowing in the ring oscillator.

14 Claims, 12 Drawing Sheets

VOLTAGE CONTROLLED OSCILLATOR CIRCUIT WITH DIFFERENT SIZED SHUNT TRANSISTORS

BACKGROUND OF THE INVENTION

1. Field of the Invention

The present invention relates to a voltage controlled oscillator circuit that is used for a phase locked loop circuit or the like. In particular, the present invention relates to a voltage controlled oscillator circuit that is capable of outputting a wide frequency range.

2. Description of the Prior Art

Conventionally, voltage controlled oscillator (VCO) circuits are used for generating a carrier or a clock signal or as an element constituting a phase locked loop (PLL) circuit in various communication devices such as a mobile telephone, computer-related devices and other various digital devices or control devices (see Japanese unexamined patent publication No. 2002-171165).

Figure 11:
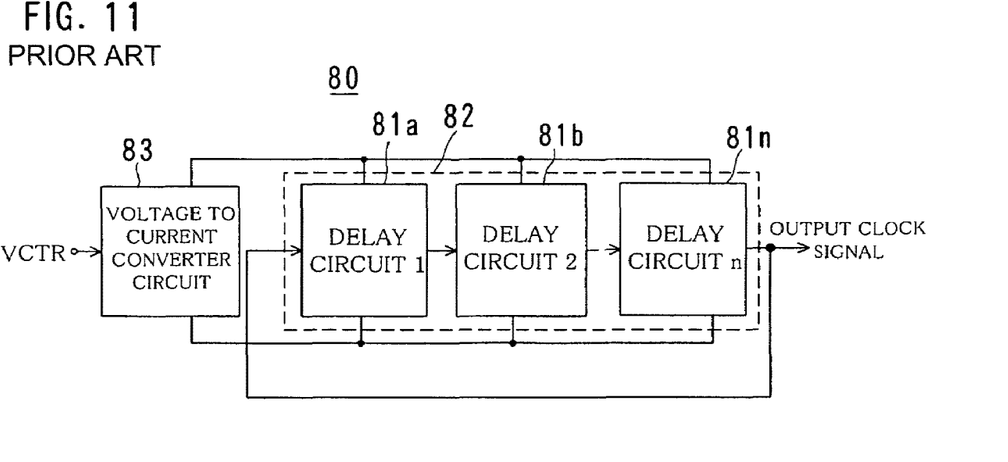
FIG. 11 is a diagram showing a general structure of a VCO.

As shown in FIG. 11, a VCO 80 is basically made up of a ring oscillator 82 including a plurality of delay circuits 81a, 81b, ..., 81n connected like a ring and a voltage to current converter circuit 83 for controlling current that flows in the ring oscillator 82 so as to alter its oscillation frequency.

The VCO 80 is required to generate little noise and have a high purity of signal. In particular, it is important to reduce a phase noise.

On the other hand, the VCO is also required to be capable of covering a frequency range that is as wide as possible. In order to realize this requirement, there are following methods.

Figure 12:
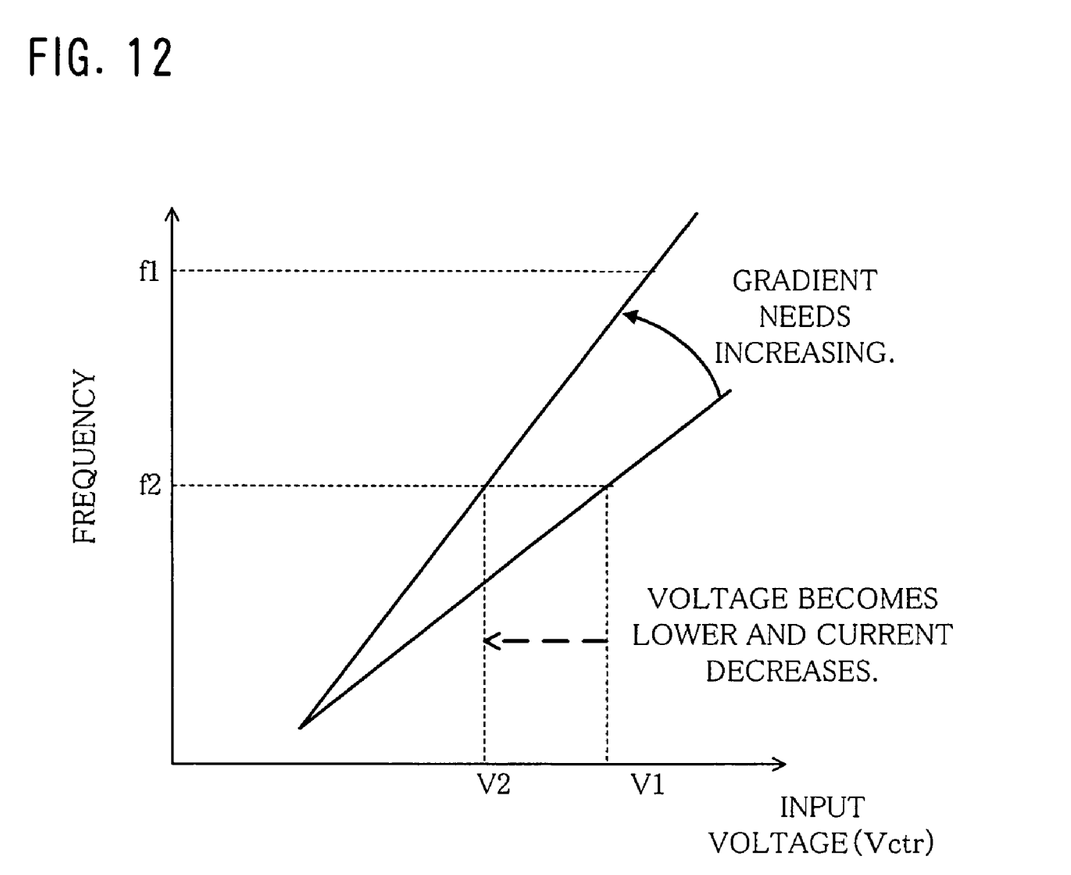
FIG. 12 is a diagram showing an example of a relationship between input voltage and an output frequency.

A first method is used for covering a frequency range by one VCO. In this case, in order to output a clock signal having a wide frequency range, a gradient of input voltage versus output frequency characteristic (a VF characteristic) is set to a large value. In other words, a gain is set to a high value. More specifically, since a frequency f outputted by the VCO is proportional to input voltage Vctr as shown in FIG. 12, a frequency range can be enlarged by increasing the gradient of the frequency f versus the input voltage Vctr.

A second method is a method of enlarging a frequency range by connecting a divider to the output terminal of the VCO so as to switch a dividing ratio of the divider.

A third method uses a plurality of VCOs having different frequency bands and switches among the plurality of VCOs so that the frequency range is enlarged.

In addition, as a fourth method, it is proposed to use a current mirror circuit so as to restrict current that flows in each of a plurality of delay circuits 81 (see Japanese unexamined patent publication No. 7-58602). More specifically, in this method, a plurality of transistors having different sizes are used, and they are switched so as to control current that flows in each of the delay circuits 81.

In the case of the first method described above, the input voltage Vctr becomes lower in a low frequency range than the case where a gradient of the VF characteristic is small, so that current of the voltage to current converter circuit 83 also decreases. For this reason, there is a problem of deterioration of the phase noise characteristics.

More specifically, there is a random noise as well as a 1/f noise as a noise generated by a MOS transistor in general. The 1/f noise is dominant in the phase noise of the VCO. A magnitude of the 1/f noise is indicated by a square of gate voltage V as follows.

$$V^2 = (K/(\text{Cox} \cdot W \cdot L)) \times (1/f),$$

where, K represents the Boltzmann constant, Cox represents a gate capacitance per unit area, W represents a gate width, L represents a gate length and f represents an output frequency.

Therefore, it is understood that the larger the values W and L of the transistor are, the smaller the 1/f noise is, if the current does not change.

On the other hand, this voltage is converted into a current noise as follows.

$$i^2 = V^2 \times gm^2,$$

where, gm represents a conductance of a transformer.

Since the phase noise is considered to be proportional to i/Id, the current noise can be expressed as follows.

$$i^2 = V^2 \times (gm^2/Id^2)$$
$$= V^2 \times 2\mu \times \text{Cox} \cdot X(W/L)/\text{Id},$$

where, μ represents a drift speed of carriers, Id represents drain current.

Therefore, it is understood that the larger the drain current is, the smaller the phase noise becomes, under the condition of the same values of W and L. In addition, the voltage to current converter circuit has higher sensitivity to the phase noise than the ring oscillator. In other words, the phase noise increases if current in the voltage to current converter circuit is decreased.

Therefore, in the case of the first method, the input voltage Vctr becomes low in a low frequency range. As a result, current in the voltage to current converter circuit is also decreased so that the phase noise increases.

In the case of the second method, there is a problem of large current consumption. Although it is expected inherently that the power consumption becomes smaller in a low frequency than in a high frequency, the power consumption becomes large in the second method since the VCO always operates at a high frequency.

In the case of the third method, there is a problem of large power consumption and a large area occupied by circuit elements since a plurality of VCOs exist.

In the case of the method disclosed in the second document (Japanese unexamined patent publication No. 7-58602), there is a problem of a complicated circuit and a large area occupied by circuit elements since each delay circuit needs transistors for the current mirror circuit.

SUMMARY OF THE INVENTION

An object of the present invention is to provide a voltage controlled oscillator circuit that is not disadvantageous in power consumption and an occupied area and is capable of enlarging a frequency range without a deterioration of the phase noise characteristics even in a low frequency range.

A voltage controlled oscillator circuit according to one aspect of the present invention includes a ring oscillator including a plurality of delay circuits that are connected like a ring and a voltage to current converter circuit for controlling current flowing in the ring oscillator so as to change an oscillation frequency thereof. The voltage to current converter circuit is provided with a shunt circuit for shunting a part of current obtained by converting the input voltage, and the shunted part of the current is used for controlling the current flowing in the ring oscillator.

Further, in the voltage controlled oscillator circuit that includes a ring oscillator including a plurality of delay circuits that are connected like a ring and a voltage to current converter circuit for controlling current flowing in the ring oscillator so as to change an oscillation frequency thereof, a current mirror circuit is provided that includes a first transistor and a second transistor connected so as to pass current that is proportional to current flowing in the first transistor, so that the second transistor controls the current flowing in the ring oscillator, and the first transistor is connected so that current of a predetermined ratio less than or equal to one to current obtained by converting input voltage of the voltage controlled oscillator circuit.

Preferably, a current switching circuit is provided for switching the predetermined ratio of the current flowing in the first transistor.

In addition, the current switching circuit includes a circuit element for shunting the current flowing in the first transistor, and the circuit element is connected in parallel with the first transistor in a manner capable of switching between connection and disconnection.

In addition, the circuit element is a third transistor consisting of one or more transistors, and each of the third transistor is connected so as to pass current that is proportional to the current flowing in the first transistor for constituting a current mirror circuit together with the first transistor.

According to the present invention, it is possible to enlarge a frequency range while preventing a deterioration of phase noise characteristics in a low frequency range without a disadvantage in power consumption and an occupied area.

DESCRIPTION OF THE PREFERRED EMBODIMENTS

The invention will now be described in detail with reference to the attached drawings.

First Embodiment

Figure 1:
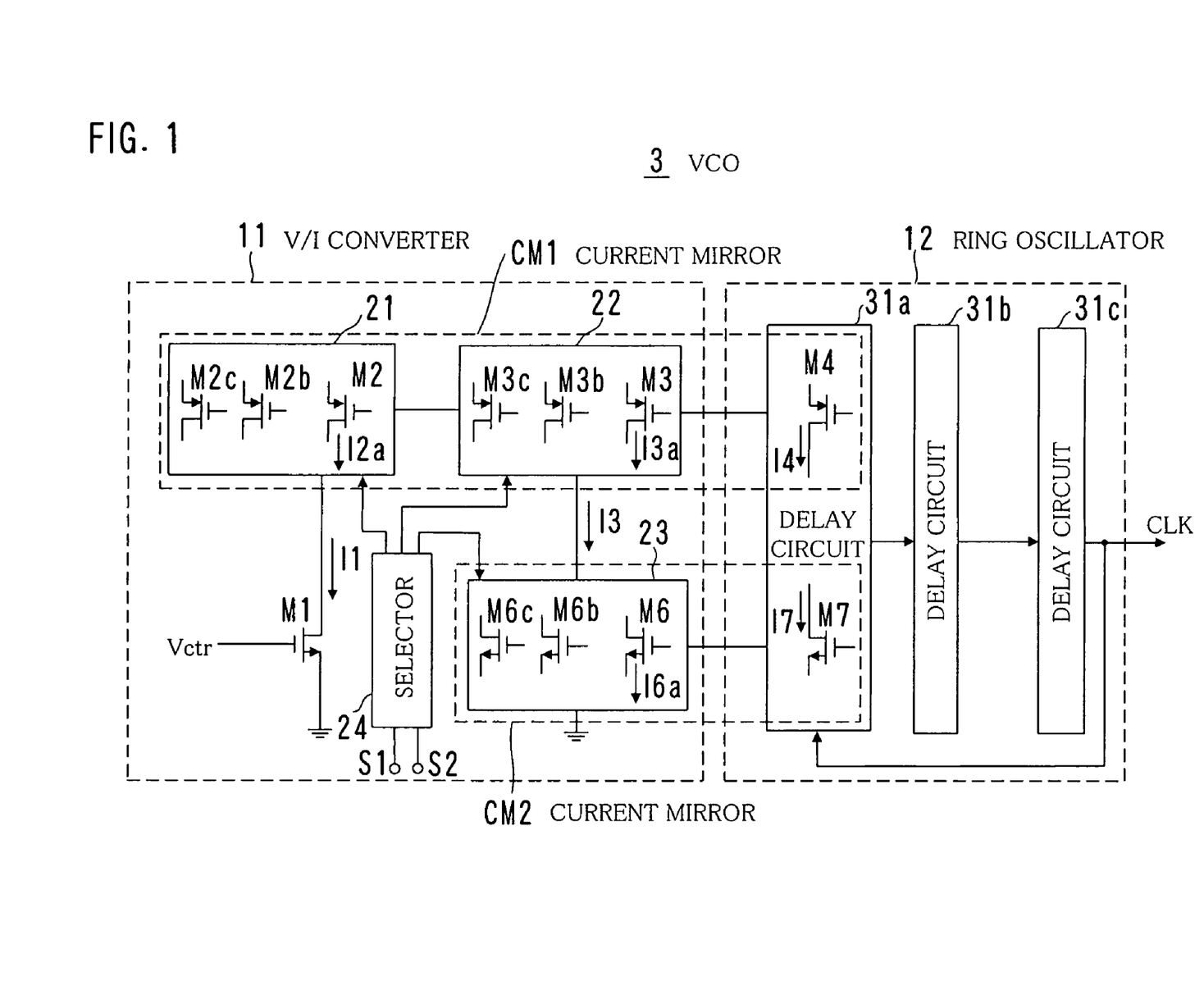
FIG. 1 is a circuit diagram of a VCO according to a first embodiment of the present invention.

FIG. 1 is a circuit diagram of a VCO 3 according to a first embodiment of the present invention.

As shown in FIG. 1, the VCO 3 is made up of a voltage to current converter circuit 11 and a ring oscillator 12.

The voltage to current converter circuit 11 converts input voltage (control voltage) Vctr that is supplied to the VCO 3 into current I1, and current that flows in the ring oscillator 12 is controlled in accordance with the generated current I1 so that an oscillation frequency is altered.

The ring oscillator 12 is made up of a plurality of delay circuits 31a, 31b and 31c that are connected like a ring. Although three delay circuits 31 are used in this embodiment, it is possible to use five, seven or other number of delay circuits. An oscillation frequency of the ring oscillator 12 alters in accordance with current flowing in each delay circuit 31. For example, as the current increases, the oscillation frequency is raised because a capacitance existing in the delay circuit 31 is charged at higher speed.

In the first embodiment, the voltage to current converter circuit 11 converts the input voltage Vctr into the current I1, and a part of the converted current I1 is used for controlling the current that flows in the ring oscillator 12.

More specifically, the voltage to current converter circuit 11 is provided with a transistor M1 for converting voltage to current, current switching circuits 21, 22 and 23, and a selector 24.

The transistor M1 is an N-channel MOS FET, which converts input voltage Vctr supplied to the gate into current I1 corresponding to the input voltage Vctr.

The current switching circuit 21 includes a transistor M2 and transistors M2$b$ and M2$c$ that are P-channel MOS FETs. The transistors M2$b$ and M2$c$ are connected so that each of them can be turned on and off.

The current switching circuits 22 and 23 also include transistors M3, M3$b$ and M3$c$ that are P-channel MOS FETs and transistors M6, M6$b$ and M6$c$ that are N-channel MOS FETs similarly to the current switching circuit 21. The transistors M3$b$ and M3$c$ and transistors M6$b$ and M6$c$ are also connected so that each of them can be turned on and off.

The selector 24 turns on and off the transistors M2$b$ and M2$c$, transistors M3$b$ and M3$c$, and transistors M6$b$ and M6$c$ responding to external selection signals S1 and S2.

As a method of switching them, the selection signal S1 is activated to turn on the transistors M2$b$, M3$b$ and M6$b$ at the same time, for example. Thus, the transistors M2, M3 and M6 are connected in parallel with the transistors M2$b$, M3$b$ and M6$b$, respectively. In addition, the selection signals S1 and S2 are activated to turn on the transistors M2$b$ and M2$c$, the transistors M3$b$ and M3$c$, and the transistors M6$b$ and M6$c$ at the same time. Thus, the transistors M2, M3 and M6 are connected in parallel with the transistors M2$b$ and M2$c$, transistors M3$b$ and M3$c$, and the transistors M6$b$ and M6$c$, respectively. In this way, responding to the selection signals S1 and S2, the transistors M2, M3 and M6 are connected in parallel with one or two transistors, respectively. Note that the connection of these transistors enables to form a current mirror circuit. This will be described in detail below.

As a structure of the selector 24, various structures can be adopted. For example, responding to the selection signals S1 and S2, gates and drains of the transistors M2$b$, M2$c$, M3$b$, M3$c$, M6$b$ and M6$c$ are selectively connected or separated. Alternatively, sources of the transistors M2$b$, M2$c$, M3$b$, M3$c$, M6$b$ and M6$c$ are selectively connected to a power source line or other circuit, or they are selectively separated from the circuit. Alternatively, such a switching circuit is provided to the current switching circuits 21, 22 and 23, and an instruction signal is sent to the switching circuit. In this case, it is possible that the switching circuit is provided with only a terminal for giving the instruction signal, and the selector 24 is eliminated. Other than that, the selector 24 can be constituted in various ways.

Next, the delay circuits 31a, 31b and 31c of the ring oscillator 12 will be described. Since the delay circuits 31a, 31b and 31c have the same circuit structure, only the delay circuit 31a will be described. Note that any one or a whole of the delay circuits 31a, 31b and 31c may be referred to as a "delay circuit 31".

The delay circuit 31a is provided with a transistor M4 that is a P-channel MOS FET and a transistor M7 that is an N-channel MOS FET. Other delay circuits 31b and 31c are also provided respectively with transistors M4 and M7 similarly to the delay circuit 31a. These transistors M4 and M7 determine a value of current I that flows in each delay circuit 31.

The transistor M4 of each delay circuit 31, the current switching circuit 21, and the current switching circuit 22 constitute a current mirror circuit CM1 including the transistor M2 as a reference transistor. The current mirror circuit CM1 duplicates current (reference current) I2a that flows in the transistor M2 that is a reference transistor to current flowing in other transistors at ratios (current mirror ratios) corresponding to sizes (element sizes W and L). It is because current that flows in two MOS transistors working in the saturation range by the same gate-source voltage have values proportional to sizes.

More specifically, in the current switching circuit 21, the current switching circuit 22, and the transistors M4 of each delay circuit 31, the current I2a flowing in the transistor M2 and each current I flowing in each of other transistors M2b, M2c, M3, M3b, M3c and M4 have a ratio corresponding to sizes of the transistors.

Therefore, supposing all these transistors have the same size, current having the same value as the current I2a flowing in the transistor M2 flows in other transistors M2b, M2c, M3, M3b, M3c and M4. In other words, each of the transistors in the current mirror circuit CM1 passes current having the same value as the current I2a flowing in the transistor M2. As a result, the current I3a flowing in the transistor M3 and the current I4 flowing in the transistor M4 have the same value as the current I2a flowing in the transistor M2, for example. As a matter of course, if the transistors M2b, M2c, M3b and M3c are turned off, no current flows in the disabled transistors.

In addition, the current switching circuit 23, and the transistor M7 of each delay circuit 31 constitute a current mirror circuit CM2 including the transistor M6 as a reference transistor.

More specifically, in the current switching circuit 23 and the transistor M7 of each delay circuit 31, a value of current (reference current) I6a flowing in the transistor M6 and values of current flowing in other transistors M6b, M6c and M7 have ratios corresponding to sizes of the transistors.

Therefore, supposing all these transistors have the same size, current having the same value as the current I6a flowing in the transistor M6 flows in other transistors M6b, M6c and M7. In other words, each of the transistors in the current mirror circuit CM2 passes current having the same value as the current I6a flowing in the transistor M6. As a result, the current I7 flowing in the transistor M7 has the same value as the current I6a flowing in the transistor M6, for example. As a matter of course, if the transistors M6b and M6c are turned off, no current flows in the disabled transistors.

As a result, if the transistors have the same size, current having the same value as the current I2a flowing in the transistor M2 that is a reference transistor flows in transistors M3, M4, M6 and M7. Therefore, I2a=I3a=I4=I6a=I7. The ring oscillator 12 oscillates at a frequency corresponding to this current and outputs a clock signal CLK.

Therefore, if the transistors M2b, M2c, M3b, M3c, M6b and M6c are turned off, the current I2a that flows in the transistor M2 has the same value as the current I1 that flows in the transistor M1, which is the same as total current of the current switching circuit 21. In addition, the current I3a flowing in the transistor M3 and the current I6a flowing in the transistor M6 have the same value as the current I1 flowing in the transistor M1, which is the same as total current I3 of the entire current switching circuits 22 and 23. Therefore, I1=I2a=I3a=I3=I4=I6a=I7.

Next, when the selector 24 turns on the transistors M2b, M3b and M6b, these are connected in parallel with the transistors M2, M3 and M6, respectively. In addition, each of them is connected so as to work as a current mirror circuit. Therefore, in this case, the same current flows in the transistor M2 and in the transistor M2b. As a result, the current I2a flowing in the transistor M2 has a value that is a half of the current I1. As a result, a value of each of the current I3a, I4, I6a, and I7 also become a half of the current I1.

In this case, since the current I3 that flows in the current switching circuits 22 and 23 is the sum of the current flowing in the two transistors M3 and M3b, it becomes a value that is twice the current I3a resulting in the same vale as the current I1.

More specifically, when the transistors M2b, M3b and M6b are turned on, the current I4 and I7 flowing in the delay circuit 31 can be reduced to a half of the current I1. In addition, the current I1 and I3 flowing in the current switching circuits 21, 22 and 23 are maintained at the same value as before. The ring oscillator 12 oscillates at a frequency corresponding to the current I4 and I7 having a half value of the current I1, i.e., at a frequency of approximately a half of the original frequency so as to output the clock signal CLK.

Next, when the selector 24 turns on the transistors M2b, M2c, M3b, M3c, M6b and M6c, these are connected in parallel with the transistors M2, M3 and M6, respectively. In addition, each of them is connected so as to work as a current mirror circuit. Therefore, in this case, the current I2a flowing in the transistor M2 becomes a value that is a third of the current I1. As a result, a value of each of the current I3a, I4, I6a and I7 also becomes a third of the current I1. A value of the current I3 that flows in the current switching circuits 22 and 23 becomes three times the current I3a resulting in the same value as the current I1.

More specifically, when the transistors M2b, M2c, M3b, M3c, M6b and M6c are turned on, the current I4 and I7 flowing in the delay circuit 31 can be reduced to a third of the current I1. In addition, the current I1 and I3 flowing in the current switching circuits 21, 22 and 23 are maintained at the same value as before. The ring oscillator 12 oscillates at a frequency corresponding to the current I4 and I7 having a third value of the current I1, i.e., at a frequency of approximately a third of the original frequency so as to output the clock signal CLK.

In this way, the current flowing in the delay circuit 31 is switched so as to alter the delay time for obtaining the clock signal CLK of a low frequency. Thus, a range of frequencies outputted from the VCO 3 can be enlarged. In addition, if the input voltage Vctr does not alter, the current I1 and I2 flowing in the voltage to current converter circuit 11 do not vary. Therefore, the phase noise characteristic is not deteriorated. In addition, power consumption in the VCO 3 that depends on the frequency of the clock signal CLK is not disadvantageous.

Further, this embodiment requires only a simple structure in which the additional transistors M2b, M2c, M3b, M3c, M6b and M6c are connected in parallel with the transistors M2, M3 and M6 in the current switching circuits 21, 22 and 23. It is not required to add various current switching circuits to each delay circuit 31 like the conventional structure, so the structure of this embodiment is advantageous in the number of components and an area occupied by them.

Although all the transistors in the current mirror circuits CM1 and CM2 have the same size as described above, it is possible to use transistors having different sizes. For example, sizes of the transistors M4 and M7 may be set to larger values or smaller values than the transistor M2. In this case, current having values of current mirror ratios corresponding to the sizes flow, and the ratio is switched to a half or a third.

Although two transistors each can be connected in parallel in the current switching circuits 21-23 in the first embodiment described above, it is possible to configure so that only one transistor or four or more transistors can be connected in parallel. If the number of transistors that can be connected in parallel is increased, a variable range of frequencies can be enlarged.

In addition, if a value of the current I3 flowing in the current switching circuits 22 and 23 does not affect the phase noise so much, it is possible to eliminate the transistors M3b, M3c, M6b and M6c so as to simplify the circuit.

Hereinafter, VCOs according to other embodiments will be described. Note that elements having the same functions as in the VCO 3 of the first embodiment will be denoted by the same reference signs, and elements having similar functions will be denoted by the same reference signs plus suffix such as B, C, D or the like, so that descriptions thereof can be omitted or simplified.

Second Embodiment

Figure 2:
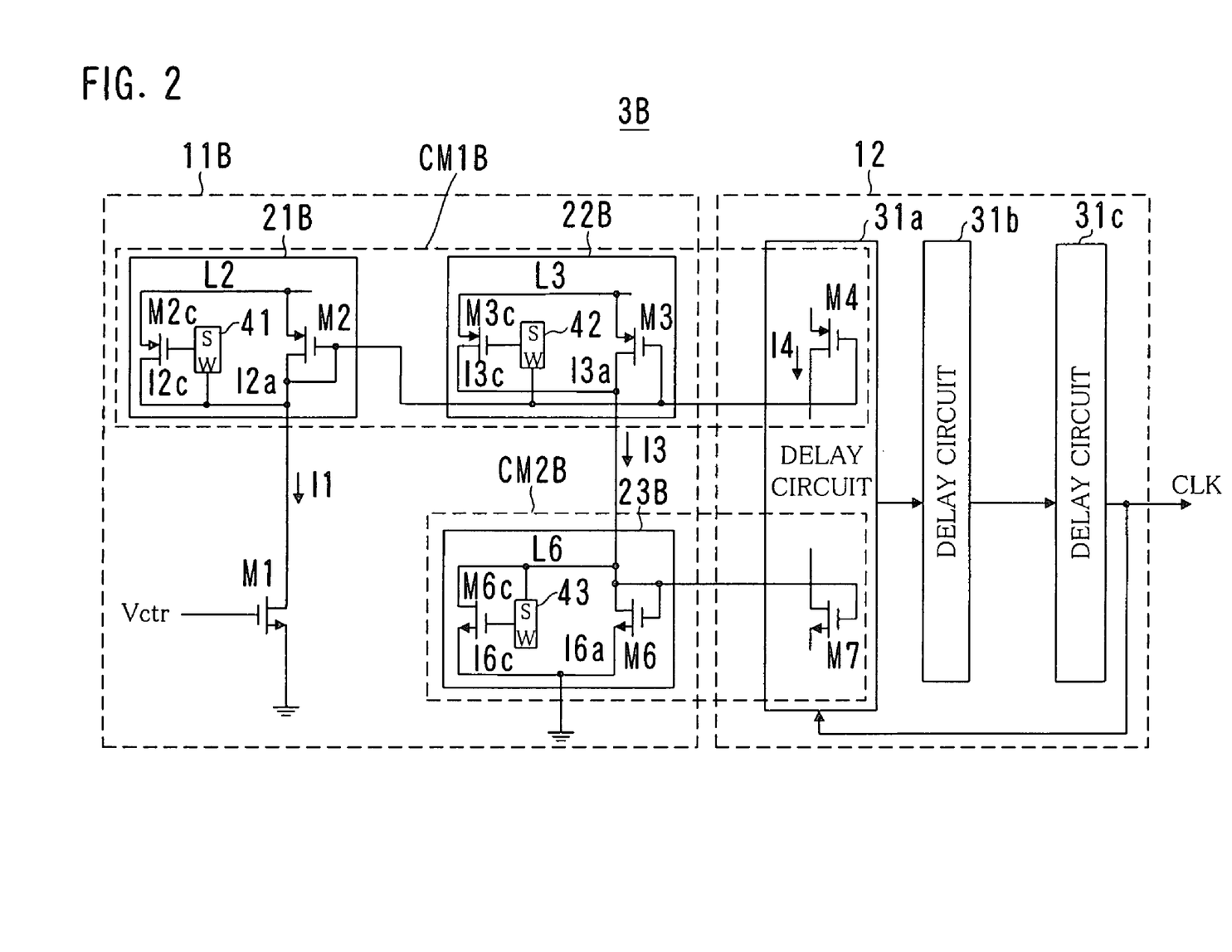
FIG. 2 is a circuit diagram of a VCO according to a second embodiment of the present invention.

FIG. 2 is a circuit diagram of a VCO 3B according to a second embodiment of the present invention.

The VCO 3B shown in FIG. 2 is provided with switching circuits 41-43 for turning on and off the transistors M2b, M2c, M3b, M3c, M6b and M6c that can be connected in parallel, and they are disposed between gates and drains of the transistors, respectively. Note that lines L2 and L3 are power source lines.

In FIG. 2, circuits for the transistors M2b, M3b and M6b and the selector 24 are omitted. It is the same in the following drawings.

When the switching circuits 41-43 are selectively turned on or off by the selector 24, the gate and the drain are selectively connected to each other or separated from each other, respectively. Thus, any one of the transistors M2b, M2c, M3b, M3c, M6b and M6c is connected in parallel with the transistors M2, M3 and M6, respectively.

Third Embodiment

Figure 3:
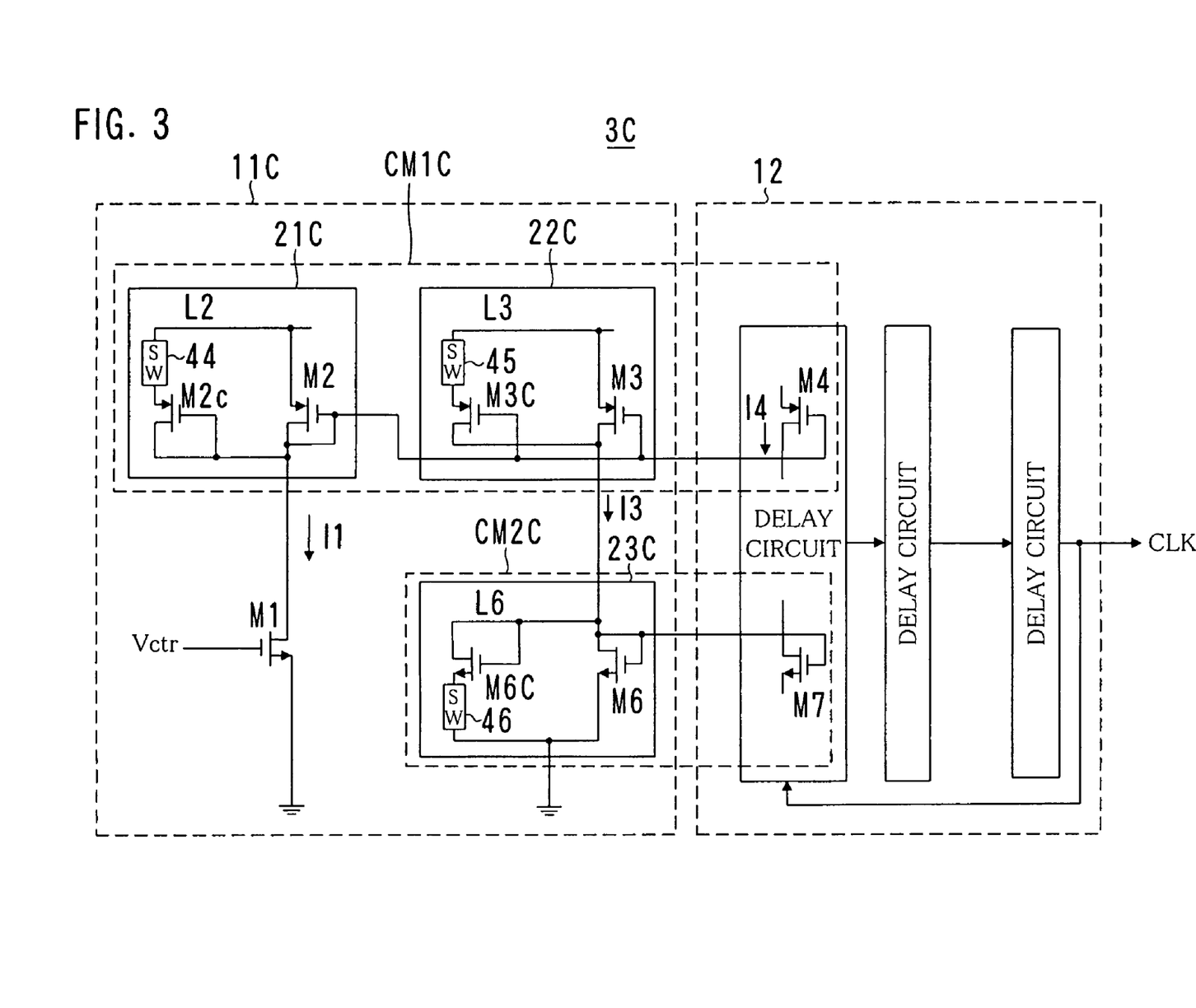
FIG. 3 is a circuit diagram of a VCO according to a third embodiment of the present invention.

FIG. 3 is a circuit diagram of a VCO 3C according to a third embodiment of the present invention.

The VCO 3C shown in FIG. 3 is provided with switching circuits 44-46 for turning on and off the transistors M2b, M2c, M3b, M3c, M6b and M6c that can be connected in parallel, and they are disposed between sources of the transistors and the lines L3, L4 and L6, respectively.

When the switching circuits 44-46 are selectively turned on or off by the selector 24, the gates and lines L3, L4 and L6 are selectively connected to each other or separated from each other, respectively. Thus, any one of the transistors M2b, M2c, M3b, M3c, M6b and M6c is connected in parallel with the transistors M2, M3 and M6, respectively.

Fourth Embodiment

Figure 4:
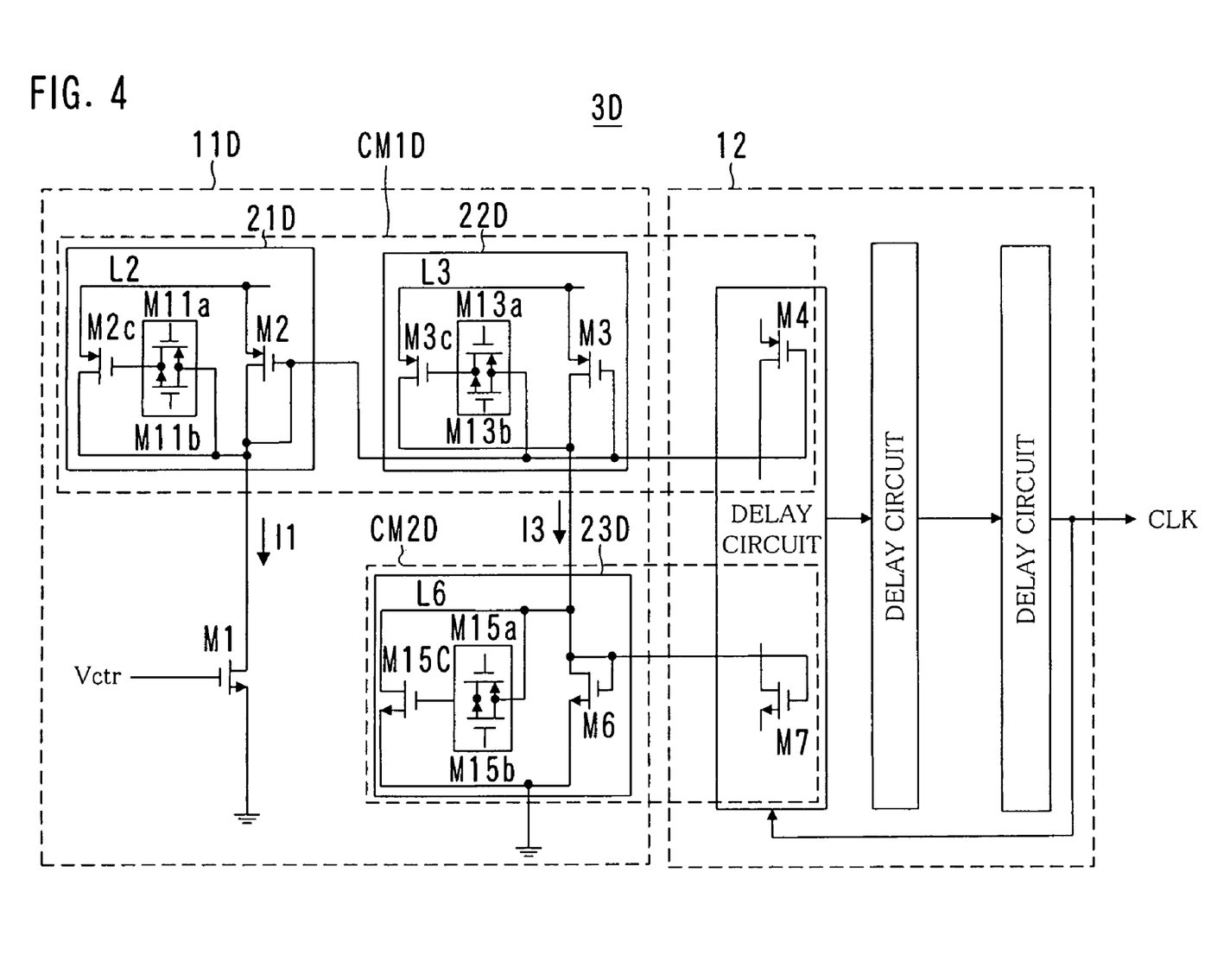
FIG. 4 is a circuit diagram of a VCO according to a fourth embodiment of the present invention.

FIG. 4 is a circuit diagram of a VCO 3D according to a fourth embodiment of the present invention.

In the VCO 3D of the fourth embodiment, the switching circuits 41-43 of the VCO 3B in the second embodiment are illustrated more concretely.

More specifically, the VCO 3D shown in FIG. 4 includes a transfer gate made up of two transistors M11a and M11b, M13a and M13b or M15a and M15b, which are a P-channel MOS FET and an N-channel MOS FET and are used for each of the switching circuits 41-43 in the second embodiment.

Each of the two transistors included in the transfer gate has a drain that is connected to a source of the other transistor. When the gate of the P-channel MOS FET is set to a "L" level and the gate of the N-channel MOS FET is set to a "H" level, they are turned on to make a short circuit. Such a signal of "L" or "H" level is outputted selectively from the selector 24, so that the transistors M2b, M2c, M3b, M3c, M6b and M6c are connected in parallel with the transistors M2, M3 and M6 selectively.

Fifth Embodiment

Figure 5:
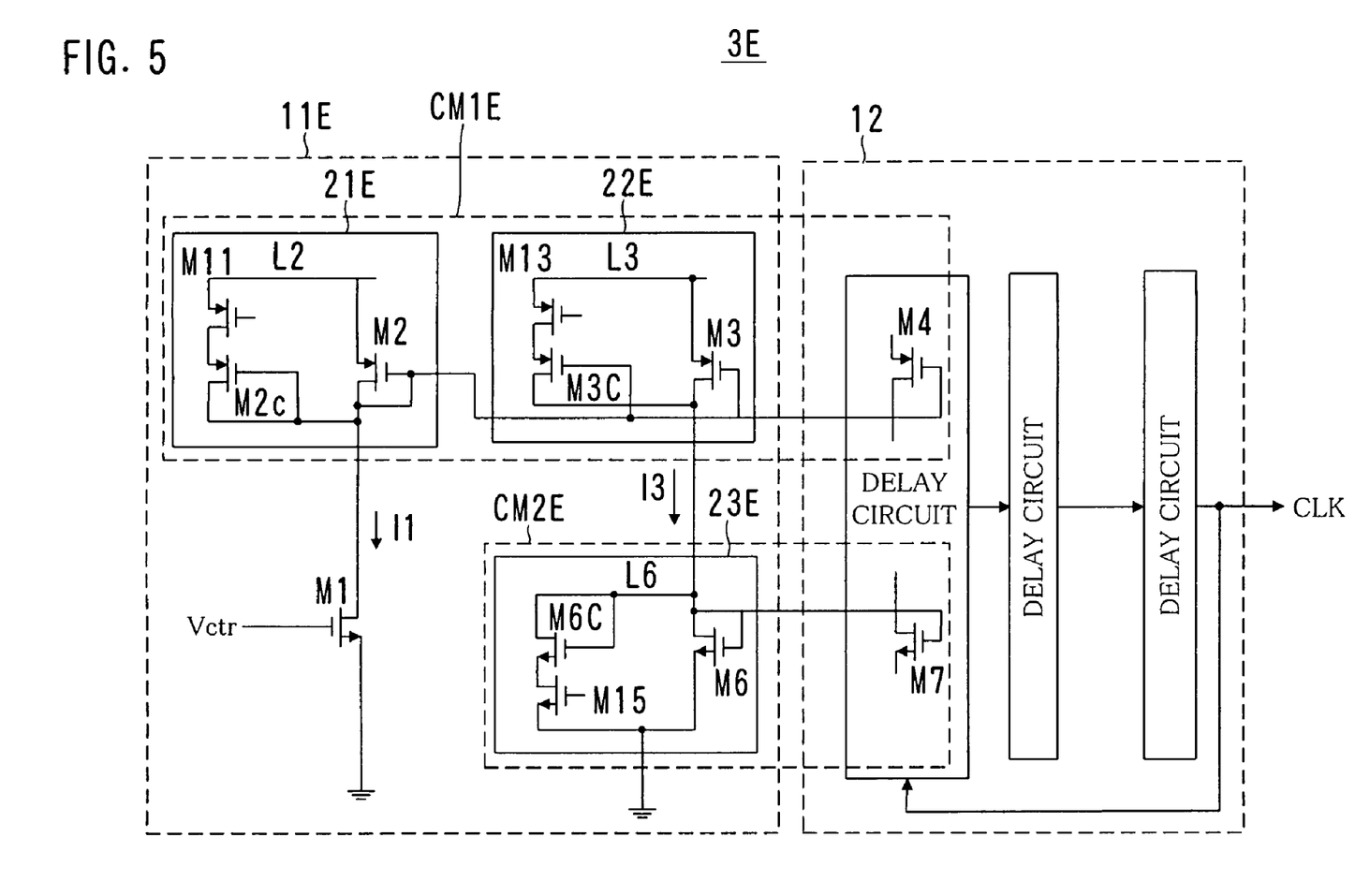
FIG. 5 is a circuit diagram of a VCO according to a fifth embodiment of the present invention.

FIG. 5 is a circuit diagram of a VCO 3E according to a fifth embodiment of the present invention.

In the VCO 3E of the fifth embodiment, the switching circuits 44-46 of the VCO 3C in the third embodiment are illustrated more concretely.

More specifically, the VCO 3E shown in FIG. 5 is provided with transistors M11, M13 and M15 as the switching circuits 44-46 in the third embodiment, and each of the transistors is a P-channel MOS FET or an N-channel MOS FET.

The selector 24 sends a signal of "H" or "L" to the gates of the transistors M11, M13 and M15 so to turn on or off the transistors. Thus, the transistors M2b, M2c, M3b, M3c, M6b and M6c are connected in parallel with the transistors M2, M3 and M6 selectively.

Sixth Embodiment

Figure 6:
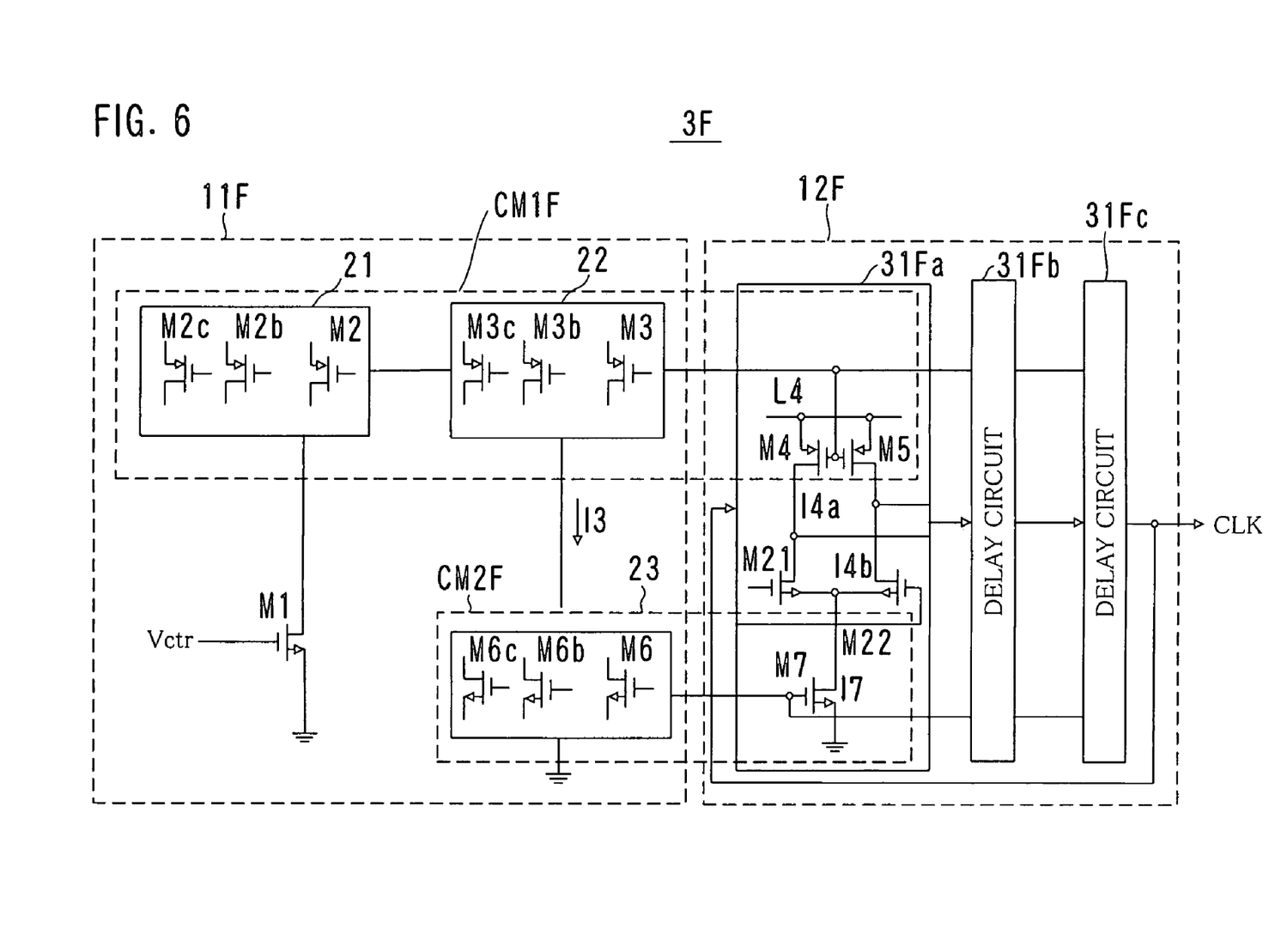
FIG. 6 is a circuit diagram of a VCO according to a sixth embodiment of the present invention.

FIG. 6 is a circuit diagram of a VCO 3F according to a sixth embodiment of the present invention.

In the VCO 3F of the sixth embodiment, each delay circuit 31 of the ring oscillator 12 in the VCO 3 of the first embodiment is illustrated more concretely. Each of the delay circuits 31Fa, 31Fb and 31Fc shown in FIG. 6 is a differential type.

More specifically, the delay circuit 31F shown in FIG. 6 uses an inverter of a differential type made up of two transistors M21 and M22 that are N-channel MOS FETs. The drains of the transistors M21 and M22 are connected respectively to the gates of the transistors M21 and M22 of the next delay circuit 31F so as to form a ring-like circuit. Values of current I4a and I4b flowing in the transistors M21 and M22 are determined by two transistors M4 and M5 that constitute the current mirror circuit CM1F. Note that the line L4 is a power source line.

In this way, the ring oscillator 12F of the differential type can be configured in the same manner as the example described above.

Seventh Embodiment

Figure 7:
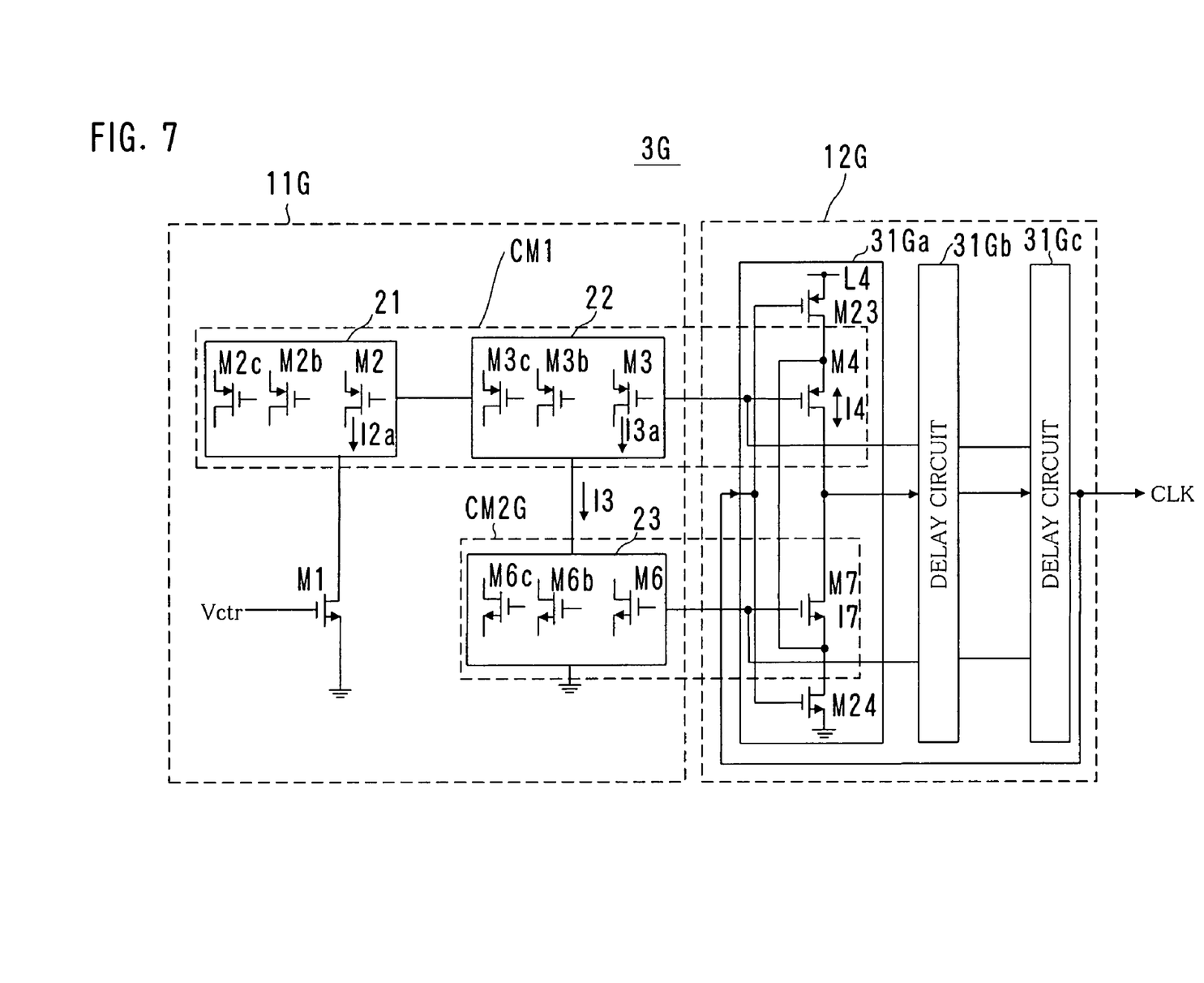
FIG. 7 is a circuit diagram of a VCO according to a seventh embodiment of the present invention.

FIG. 7 is a circuit diagram of a VCO 3G according to a seventh embodiment of the present invention.

In the VCO 3G of the seventh embodiment, a circuit structure of a delay circuit 31G that is different from the circuit structure of the delay circuits 31-31F of the embodiments described above is illustrated concretely.

More specifically, the delay circuit 31G shown in FIG. 7 is provided with an inverter made up of two transistors M23 and M24 and a transfer gate made up of two transistors M4 and M7 that are a P-channel MOS FET and an N-channel MOS FET. The transistors M4 and M7 constitute a part of current mirror circuits CM1G and CM2G, respectively.

Values of current I4 and I7 flowing in the transistors M23 and M24 are determined by current flowing in the two transistors M4 and M7 included in the current mirror circuits CM1G and CM2G, respectively.

Eighth Embodiment

Figure 8:
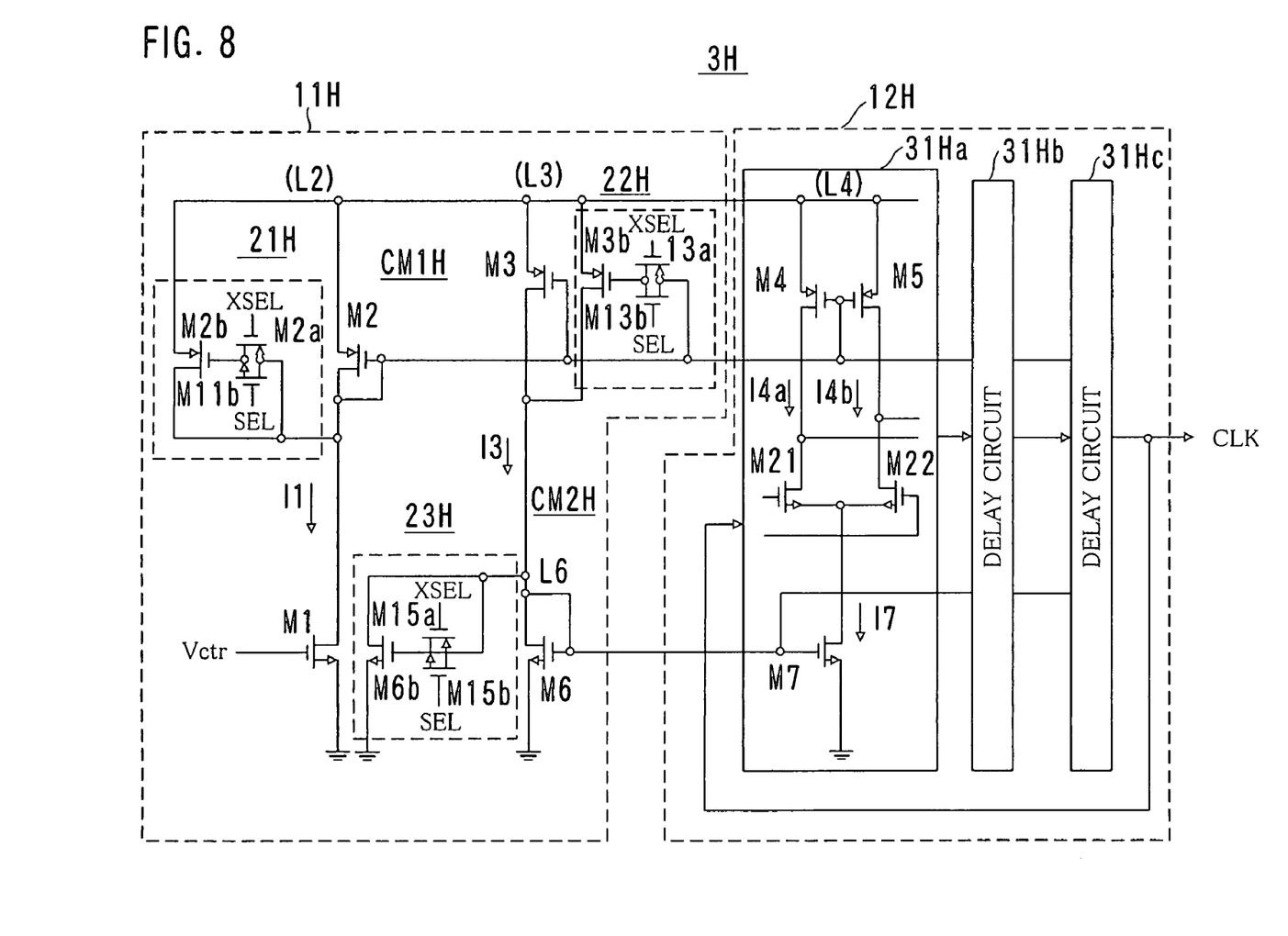
FIG. 8 is a circuit diagram of a VCO according to an eighth embodiment of the present invention.

FIG. 8 is a circuit diagram of a VCO 3H according to an eighth embodiment of the present invention.

The VCO 3H of the eighth embodiment is provided with a voltage to current converter circuit 11H that is similar to the voltage to current converter circuit 11D in the fourth embodiment and a ring oscillator 12H that is similar to the ring oscillator 12F in the sixth embodiment. However, there is shown only one transistor that is connected in parallel with each of the current switching circuits 21H, 22H and 23H.

The VCO 3H shown in FIG. 8 is provided with a transfer gate as a switching circuit of each of the current switching circuits 21H, 22H and 23H in the voltage to current converter circuit 11H. In addition, each delay circuit 31H of the ring oscillator 12H is a differential type. Note that it is possible to connect an appropriate capacitance (a capacitor) to each delay circuit 31H.

The transistor M2 as a reference transistor constitutes a current mirror circuit CM1H together with transistors M2b, M3, M3b, M4 and M5. In addition, the transistor M6 as a reference transistor constitutes a current mirror circuit CM2H together with transistors M6b and M7.

When a signal of "H" or "L" is sent to each of the gates of the transistors M11a, M11b, M13a, M13b, M15a and M15b from a selector (not shown) or the like, current I4a, I4b and I7 flowing in each delay circuit 31H of the ring oscillator 12H can be altered so as to change a frequency of the clock signal CLK without changing the current I1 and I2.

Ninth Embodiment

Figure 9:
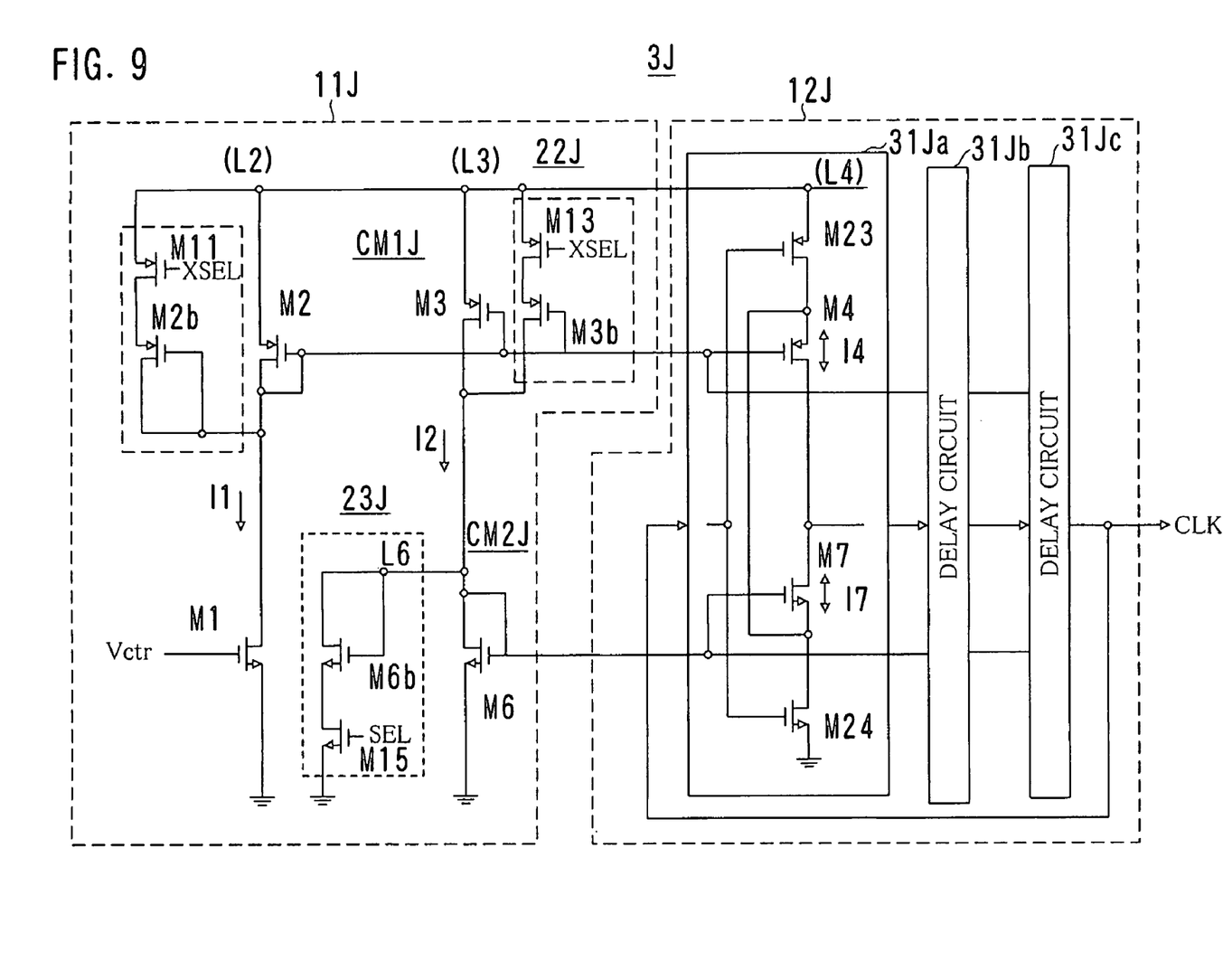
FIG. 9 is a circuit diagram of a VCO according to a ninth embodiment of the present invention.

FIG. 9 is a circuit diagram of a VCO 3J according to a ninth embodiment of the present invention.

The VCO 3J of the ninth embodiment is provided with a voltage to current converter circuit 11J that is similar to the voltage to current converter circuit 11E in the fifth embodiment and a ring oscillator 12J that is similar to the ring oscillator 12G in the seventh embodiment.

More specifically, each delay circuit 31J of the VCO 3J shown in FIG. 9 is provided with an inverter made up of two transistors M23 and M24 and a transfer gate made up of two transistors M4 and M7.

The transistor M2 as a reference transistor constitutes a current mirror circuit CM1J together with transistors M2b, M3, M3b and M4. In addition, the transistor M6 as a reference transistor constitutes a current mirror circuit CM2J together with transistors M6b and M7.

When a signal of "H" or "L" is sent to each of the gates of the transistors M11, M13 and M15 from a selector (not shown) or the like, current I4 and I7 flowing in each delay circuit 31J of the ring oscillator 12J can be altered so as to change a frequency of the clock signal CLK without changing the current I1 and I2.

According to each embodiment described above, current flowing in the delay circuit 31 can be switched securely so as to change a frequency by turning on or off each of the transistors in the current switching circuits 21, 22 and 23.

Figure 10:
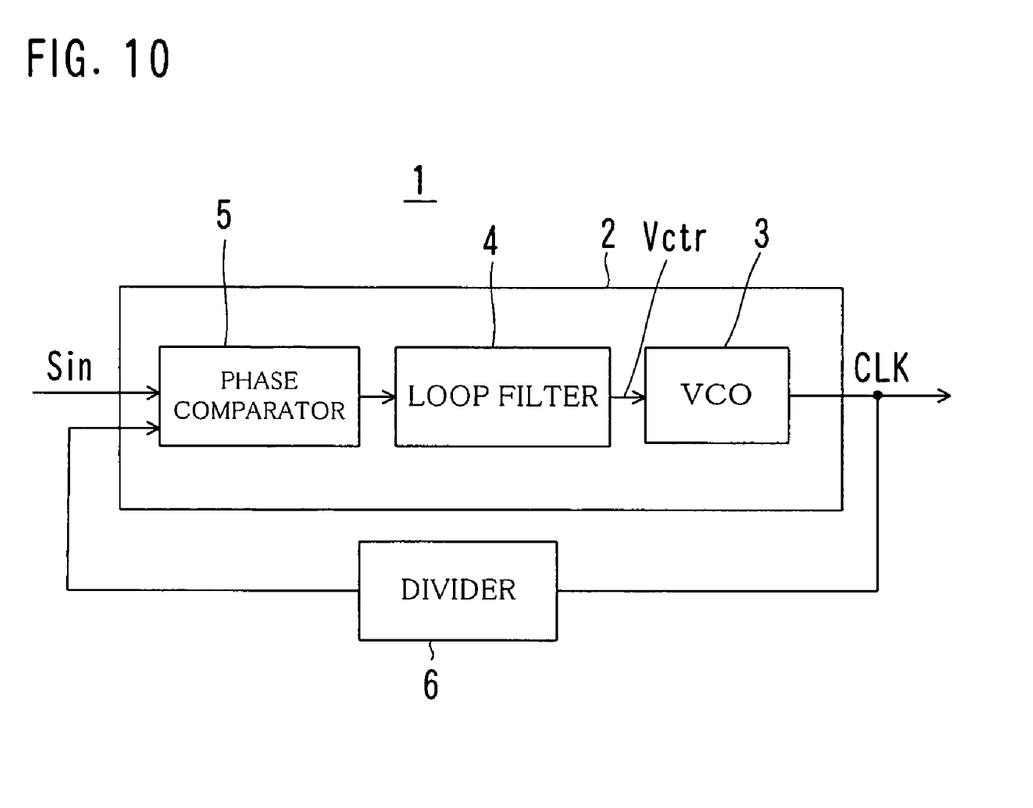
FIG. 10 is a block diagram showing an example of a PLL synthesizer.

FIG. 10 is a block diagram showing an example of a PLL synthesizer 1 made up of one of the VCO 3 described above.

As shown in FIG. 10, the PLL synthesizer 1 includes a PLL circuit made up of a VCO 3, a loop filter 4 and a phase comparator 5, and a divider 6. The PLL synthesizer 1 outputs a clock signal CLK that is in synchronization with an input signal Sin and corresponds to a dividing ratio of the divider 6.

In each embodiment described above, the transistor M2 corresponds to a first transistor in the present invention, and the transistors M2b and M2c correspond to a third transistor in the present invention. In addition, the transistor M3 corresponds to a fourth positive side transistor in the present invention, the transistor M6 corresponds to a fourth negative side transistor in the present invention, the transistors M3b and M3c correspond to a fifth transistor in the present invention, and the transistors M6b and M6c correspond to a sixth transistor in the present invention. In addition, the transistor M4 corresponds to a second positive side transistor in the present invention, and the transistor M7 corresponds to a second negative side transistor in the present invention.

In each embodiment described above, the structure of the voltage to current converter circuit 11, the structure of the current switching circuit or the number of the elements that can be connected, the circuit structure of the switching circuit or circuit elements that are used, the structure of the current mirror circuit or the current mirror ratio, the circuit structure of the delay circuit or the number thereof, the structure of the ring oscillator, the type or the number of transistors that are used, the structure of VCO, the structure of PLL and the like can be modified in accordance with the spirit of the present invention without limiting to the above description.

Although the embodiment of the present invention is described above with several examples, the present invention should not be understood as limited to the above embodiment but can be embodied in various ways.

While example embodiments of the present invention have been shown and described, it will be understood that the present invention is not limited thereto, and that various changes and modifications may be made by those skilled in the art without departing from the scope of the invention as set forth in the appended claims and their equivalents.

What is claimed is:

1. A voltage controlled oscillator circuit comprising:
   a ring oscillator including a plurality of delay circuits that are connected like a ring; and
   a voltage to current converter circuit for converting input voltage into a control current that corresponds to voltage of the input voltage to control current flowing in the ring oscillator, wherein each of the plurality of delay circuits comprises first and second transistors,
   the voltage to current converter circuit comprises first and second current switching circuits,
   the first and second current switching circuits comprise shunt circuits, respectively,
   the first current switching circuit and the first transistor together form a first current mirror circuit, and
   the second current switching circuit and the second transistor together form a second current mirror circuit, and
   wherein, by turning on and off the shunt circuits, current flowing through the first transistor of the first current mirror circuit is controlled and current flowing through the second transistor of the second current mirror circuit is controlled so as to change an oscillation frequency of the ring oscillator.

2. A phase locked loop circuit comprising the voltage controlled oscillator circuit according to claim 1.

3. A voltage controlled oscillator circuit comprising:
a ring oscillator including a plurality of delay circuits that are connected like a ring; and
a voltage to current converter circuit that receives input voltage for changing an oscillation frequency of the ring oscillator and converts the input voltage into control current corresponding to voltage of the input voltage to control current flowing in the ring oscillator, wherein
each of the plurality of delay circuits comprises a second positive side transistor and a second negative side transistor,
the voltage to current converter circuit comprises first, second, and third current switching circuits so that the oscillation frequency is changed,
the first, second, and third current switching circuits comprise a first transistor, a fourth positive side transistor, and a fourth negative side transistor, respectively, and comprise a first shunt circuit including a third transistor, a second shunt circuit including a fifth transistor, and a third shunt circuit including a sixth transistor, respectively,
the first and second current switching circuits and the second positive side transistor together form a first current mirror circuit,
the third current switching circuit and the second negative side transistor together form a second current mirror circuit, and
currents flowing in the first, second, and third current switching circuits are shunted by the first, second, and third shunt circuits, respectively so that current flowing through the second positive side transistor is controlled by the first current mirror circuit, and current flowing through the second negative side transistor is controlled by the second current mirror circuit to change the oscillation frequency.

4. The voltage controlled oscillator circuit according to claim 3, wherein the second transistor is provided to each of the plurality of delay circuits, and each of the second transistors controls the current flowing in each of the delay circuits.

5. The voltage controlled oscillator circuit according to claim 3, wherein the first transistor, the second positive side transistor, the second negative side transistor and the third transistor are made up of MOS-FETs.

6. The voltage controlled oscillator circuit according to claim 5, wherein the switching is performed by turning on and off a gate of the third transistor.

7. The voltage controlled oscillator circuit according to claim 6, wherein either a P-channel MOS-FET or an N-channel MOS-FET is used singularly for each of the switching of the third transistor.

8. The voltage controlled oscillator circuit according to claim 6, wherein a transfer gate is used for each of the switching of the third transistor, and the transfer gate includes a P-channel MOS-FET and an N-channel MOS-FET whose drains and sources are connected to each other.

9. The voltage controlled oscillator circuit according to claim 5, wherein the switching is performed by turning on and off a source of the third transistor.

10. The voltage controlled oscillator circuit according to claim 3, wherein
the fourth positive side transistor and the fourth negative side transistor are provided and connected so as to pass current there-through that is proportional to the current flowing through the first transistor,
the second positive side transistor is connected so as to pass current there-through that is proportional to the current flowing through the first transistor, and
the second negative side transistor is connected so as to pass current there-through that is proportional to the current flowing through the fourth negative side transistor.

11. The voltage controlled oscillator circuit according to claim 10, wherein the fourth positive side transistor and the fourth negative side transistor are provided with the second and third shunt circuits, respectively, so that current of the same value as the current generated corresponding to the input voltage of the voltage controlled oscillator circuit flows in a series circuit made up of the fourth positive side transistor and the fourth negative side transistor.

12. The voltage controlled oscillator circuit according to claim 11, wherein
the shunt circuit for the fourth positive side transistor is a fifth transistor that constitutes a current mirror circuit together with the first transistor, and
the shunt circuit for the fourth negative side transistor is a sixth transistor that constitutes a current mirror circuit together with the fourth negative side transistor.

13. The voltage controlled oscillator circuit according to claim 3, wherein the ring oscillator is a differential type.

14. The voltage controlled oscillator circuit according to claim 3, wherein each of the plurality of delay circuits is made up of an inverter and a transfer gate including a P-channel MOS-FET and an N-channel MOS-FET whose drain and source are connected to each other.

* * * * *